(12) United States Patent
Abraham et al.

(10) Patent No.: US 7,301,801 B2
(45) Date of Patent: Nov. 27, 2007

(54) TUNED PINNED LAYERS FOR MAGNETIC TUNNEL JUNCTIONS WITH MULTICOMPONENT FREE LAYERS

(75) Inventors: David W. Abraham, Croton-on-Hudson, NY (US); Daniel Christopher Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 11/260,907

(22) Filed: Oct. 28, 2005

(65) Prior Publication Data

US 2007/0097731 A1    May 3, 2007

(51) Int. Cl.
*G11C 11/00* (2006.01)
(52) U.S. Cl. .................. 365/158; 365/171; 257/420
(58) Field of Classification Search ............... 257/420, 257/421, 422, 425, 427; 365/158, 171
See application file for complete search history.

(56) References Cited

U.S. PATENT DOCUMENTS

| | | | |
|---|---|---|---|
| 6,233,172 B1 * | 5/2001 | Chen et al. ............... | 365/173 |
| 6,545,906 B1 * | 4/2003 | Savtchenko et al. ....... | 365/158 |
| 6,633,498 B1 | 10/2003 | Engel et al. | |
| 2006/0034117 A1 * | 2/2006 | Jeong et al. .............. | 365/158 |
| 2006/0221674 A1 * | 10/2006 | Braun et al. ............. | 365/158 |

OTHER PUBLICATIONS

D.C. Worledge, "Spin Flop Switching for Magnetic Random Access Memory," Applied Physics Letters, vol. 84, No. 22, pp. 4559-4561, May 31, 2004.
D.C. Worledge, "Magnetic Phase Diagram of Two Identical Coupled Nanomagnets," Applied Physics Letters, vol. 84, No. 15, pp. 2847-2849, Apr. 12, 2004.

* cited by examiner

*Primary Examiner*—Mary Wilczewski
*Assistant Examiner*—Paul E Patton
(74) *Attorney, Agent, or Firm*—Ido Tuchman; Ryan, Mason & Lewis, LLP

(57) ABSTRACT

Apparatus and methods for optimizing a toggle window for a magnetic tunnel junction (MTJ) having a multicomponent free layer are provided. In accordance with an aspect of the invention, a MTJ comprises a free layer, a pinned layer, and a barrier layer formed between the free layer and the pinned layer. The free layer, in turn, includes a plurality of free magnetic sublayers while the pinned layer includes a plurality of pinned magnetic sublayers. Each of the pinned magnetic sublayers exerts a magnetic field on the free magnetic sublayers. To optimize the toggle window for the device, the dimensions of each of the pinned magnetic sublayers are selected to substantially equalize average magnetic fields acting on each of the free magnetic sublayers.

21 Claims, 3 Drawing Sheets

TUNED PINNED LAYERS FOR MAGNETIC TUNNEL JUNCTIONS WITH MULTICOMPONENT FREE LAYERS

FIELD OF THE INVENTION

The present invention relates to semiconductor devices, and, more particularly, to improving switching performance in magnetic tunnel junctions with multicomponent free layers.

BACKGROUND OF THE INVENTION

Magnetoresistive random access memory (MRAM) utilizes magnetic tunnel junctions (MTJs) to store digital information. A MTJ typically comprises a pinned magnetic layer and a free magnetic layer separated by a dielectric barrier layer. The pinned magnetic layer has a magnetic orientation which is fixed in a preferred direction while the free magnetic layer is allowed to switch direction when exposed to an applied magnetic field. The resistance of the device depends on the magnetic orientation of the layers on either side of the barrier layer. If the magnetic orientations of the layers are parallel relative to one another, the resistance across the barrier is lower, while if the magnetic orientation of the layers are antiparallel relative to one another, the resistance is higher. The relative change in resistance is termed magnetoresistance, and is expressed in a percentage change with respect to the lower resistance value.

In order to switch a MTJ (i.e. write the memory cell), magnetic fields are applied using on-chip currents through wordlines and bitlines placed near the device. One MTJ architecture relies on the switching of a free layer composed of a single material that is patterned into a sub-micron island. In this configuration, the single-component free layer is switched by the application of fields in the two in-plane directions by currents flowing through the wordlines and bitlines. Half-selected bits (i.e. those which are subject to fields in only one of the two in-plane directions) are not switched, due to the asteroid-shaped switching curve that characterizes the magnetic switching behavior of these devices. Nevertheless, while such an architecture may work reliably for larger MTJs, it becomes problematic as the device geometries shrink. As the lateral dimensions of the single-component free layer are reduced, the activation energy of the MTJ against thermally activated switching is also reduced, even for half-selected devices. This can make it difficult to switch one selected MTJ in an array without also inadvertently switching other devices.

Recently, a MTJ architecture with a free layer comprising two or more magnetic sublayers has been developed that avoids these problems, while also providing other advantages. Where two magnetic sublayers are utilized in the free layer, for example, these free magnetic sublayers are generally antiparallel to one another and separated by a thin non-magnetic layer. With this configuration, the multicomponent free layer is switched by applying current to the wordlines and bitlines in a sequence of timed pulses so as to induce a direct-write or toggle-write phenomenon in the free magnetic sublayers. This multicomponent free layer configuration has the advantage of providing a highly selective method of writing to the MTJs in an array due, at least in part, to an enhanced switching activation energy of half-selected devices.

Despite these advantages, however, MTJs with free layers comprising two or more magnetic sublayers are susceptible to geometric effects that are not present in MTJs with single-component free layers. More specifically, because one of the magnetic sublayers in a multicomponent free layer device is slightly closer to the pinned layer, it may feel a stronger magnetic field from the pinned layer than the other free magnetic sublayers. This field difference, averaged over the device area, can be many tens of Oersted and becomes more pronounced as the device becomes smaller. Such an asymmetry in magnetic fields acting on the free magnetic sublayers adversely affects the switching of the device. Therefore, only when this asymmetry is reduced will the largest toggle window (i.e., the greatest range of magnetic fields over which toggle-write operations work) be obtained.

Consequently, there is a need to reduce the magnetic asymmetry present in MTJs with free layers comprising multiple magnetic sublayers.

SUMMARY OF THE INVENTION

The present invention addresses the above-identified needs by providing, in an illustrative embodiment, apparatus and methods for reducing magnetic asymmetries in MTJs with multicomponent free layers. The invention achieves this, in part, by configuring, or tuning, one or more pinned layers such that the average magnetic fields arising from the pinned layers and acting on each of the magnetic sublayers in the free layer are substantially equal.

In accordance with an aspect of the invention, a semiconductor device comprises a free layer, a pinned layer, and a barrier layer formed between the free layer and the pinned layer. The free layer, in turn, comprises a plurality of free magnetic sublayers while the pinned layer comprises a plurality of pinned magnetic sublayers. Each of the pinned magnetic sublayers exerts a magnetic field on the free magnetic sublayers. To accomplish a purpose of the invention, the dimensions of each of the pinned magnetic sublayers are selected to substantially equalize the average magnetic fields acting on each of the free magnetic sublayers.

In accordance with another aspect of the invention, a semiconductor device comprises a free layer, a barrier layer with a first side and second side, a spacer layer, and first and second pinned layers. The free layer, in turn comprises a plurality of free magnetic sublayers. The barrier layer is in contact with the first side of the free layer while the spacer layer is in contact with the second side of the free layer. Moreover, the first pinned layer is separated from the free layer by the barrier layer and the second pinned layer is separated from the free layer by the spacer layer. Each of the first and second pinned layers exerts a magnetic field on the free magnetic sublayers. Again, to accomplish a purpose of the invention, the first and second pinned layers are configured to substantially equalize the average magnetic fields acting on each of the free magnetic sublayers.

In an illustrative embodiment, a MTJ comprises a free layer and a pinned layer. The free layer, in turn, comprises two free magnetic sublayers that are of the same dimensions. The pinned layer also contains two magnetic sublayers, more particularly, a lower pinned magnetic sublayer and an upper pinned magnetic sublayer, wherein the upper magnetic sublayer is adjacent to the barrier layer. Both of the pinned magnetic sublayers exert magnetic fields on the two free magnetic sublayers. In accordance with aspects of the invention, the lower pinned magnetic sublayer is made thicker than the upper pinned magnetic sublayer to substantially equalize the average magnetic fields acting on each of the free magnetic sublayers. Advantageously, the toggle window for the MTJ is thereby increased.

These and other features and advantages of the present invention will become apparent from the following detailed description which is to be read in conjunction with the accompanying drawings.

DETAILED DESCRIPTION OF THE INVENTION

The present invention will be described with reference to illustrative embodiments in accordance with aspects of the present invention. As a result, numerous modifications and variations can be made to the embodiments described herein and the results will still come under the scope of this invention. No limitations with respect to the specific embodiments described are intended or should be inferred.

It should also be noted that the various layers and/or regions shown in the accompanying figures are not drawn to scale, and that one or more layers and/or regions of a type commonly used in integrated circuits may not be explicitly shown in a given figure for ease of explanation. This does not imply that the layer(s) and/or regions(s) not explicitly shown are omitted from the actual integrated circuit.

Figure 1:
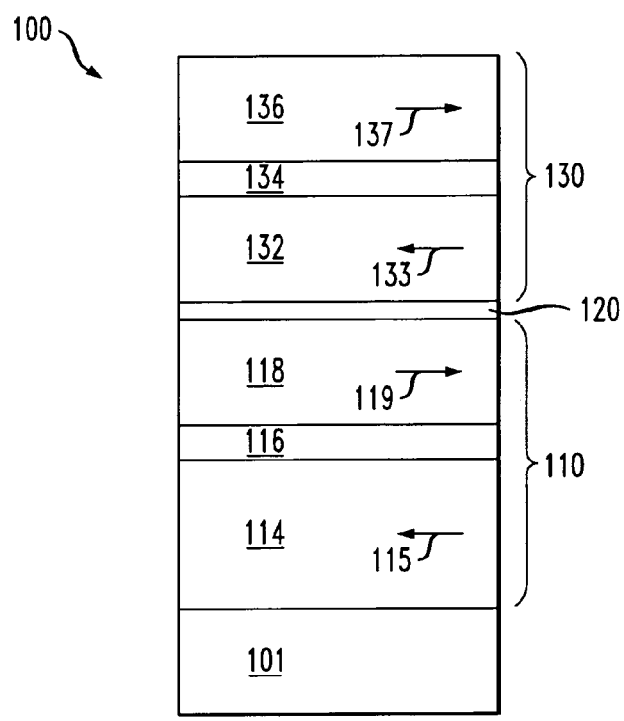
FIG. 1 shows a simplified sectional view of a MTJ in accordance with a first illustrative embodiment of the present invention.

FIG. 1 illustrates a simplified sectional view of a MTJ 100 in accordance with an illustrative embodiment of the present invention. The MTJ is sandwiched between a wordline and bitline, which are not shown in the figure. The wordline is positioned on top of the MTJ, and the bitline is positioned on the bottom of the MTJ, although the invention contemplates alternative configurations for the word and bit lines.

The MTJ 100 includes a pinned layer 110 and a free layer 130. A barrier layer 120 lies in between the pinned layer 110 and the free layer 130. The pinned layer 110, in turn, comprises a lower pinned magnetic sublayer 114 and an upper pinned magnetic sublayer 118, separated by an antiferromagnetic coupling sublayer 116. The free layer 130 also comprises three sublayers, more particularly, a lower free magnetic sublayer 132 and an upper free magnetic sublayer 136, separated by a spacer sublayer 134. The spacer sublayer 134 can either exchange couple the free magnetic sublayers 132, 136 or merely act as a non-magnetic spacer. An antiferromagnetic layer 101 lies below the pinned layer 110.

In the embodiment illustrated in FIG. 1, the free magnetic sublayers 132, 136 have substantially the same dimensions. However, in accordance with an aspect of the invention, the lower pinned magnetic sublayer 114 is thicker than the upper pinned magnetic sublayer 118. The reasons for the thickness difference in the pinned magnetic sublayers will be described in greater detail below.

The antiferromagnetic coupling sublayer 116 will preferably include at least one of the elements Ru, Os, Re, Cr, Rh and Cu. The spacer sublayer 134 may also include at least one of these same elements and, in addition, conductive materials such as Ta, TaN, TiN and W. In contrast, the magnetic sublayers 114, 118, 132, 136 will preferably include at least one of the elements Ni, Fe, Mn and Co, thereby making these sublayers ferromagnetic. Because of their ferromagnetic properties, each of the magnetic sublayers 114, 118, 132, 136 will have an associated magnetic moment vector, shown in FIG. 1 as arrows labeled 115, 119, 133 and 137, respectively. Moreover, because of a combination of dipolar coupling and any exchange coupling provided by the spacer sublayer, the free magnetic moment vectors 133, 137 will tend to remain antiparallel with respect to each other. Likewise, because of the antiferromagnetic exchange coupling provided in part by antiferromagnetic coupling sublayer 116, the pinned magnetic moment vectors 114, 118 will also tend to remain antiparallel with respect to each other.

In the illustrative embodiment shown in FIG. 1, the pinned magnetic moment vectors 115, 119 are not free to rotate in the presence of an applied magnetic field of a magnitude that would normally be generated in the MTJ 100. This restriction to rotation occurs because of the coupling between pinned layer 110 and the adjacent antiferromagnetic layer 101, and the strong exchange coupling between the pinned magnetic sublayers 114, 118 due to antiferromagnetic coupling sublayer 116. The pinned layer therefore acts as a reference. The free magnetic moment vectors 133, 137, on the other hand, are free to rotate in an applied magnetic field generated by the wordlines and bitlines. The orientation of the free magnetic moment vectors within the free layer 130 thereby acts to establish the state of the MTJ for the purpose of storing digital information.

Figure 2:
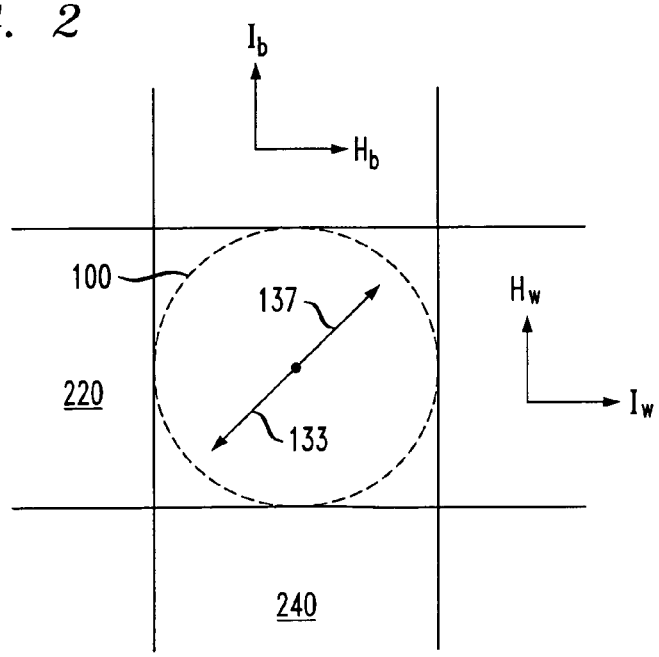
FIG. 2 shows a plan view of the FIG. 1 embodiment.

Furthermore, each of the magnetic sublayers 114, 118, 132, 136 is preferably configured to have a preferred easy magnetic axis (i.e., induced anisotropy) oriented at an angle about 45 degrees from the directions of the wordlines and bitlines. This orientation allows the free magnetic moment vectors 133, 137 to be switched using a particular sequence of wordline and bitline currents, described in more detail below. FIG. 2 shows a simplified plan view of the MTJ 100 with a bitline 220 and a wordline 240. The wordline and bitline are orthogonal to one another, although the present invention is not limited to the specific arrangement shown. Moreover, the figure clearly shows the 45 degree angle between the free magnetic moment vectors and the wordline/bitline. The direction of positive current flow in the wordline and bitline are also shown in FIG. 2 as $I_w$ and $I_b$, respectively. Positive current flow in the wordline and bitline produce circumferential magnetic fields $H_w$ and $H_b$, respectively.

The magnetic sublayers 114, 118, 132, 136 are preferably produced by sputter deposition techniques that will be familiar to one skilled in the semiconductor processing art. However, other deposition techniques can be used and still fall within the scope of this invention. In sputter deposition, ions are generated and directed at a target formed of the material intended to be deposited. The ions knock off target atoms which are transported to the substrate where they condense and form a film. Such a deposition technique is further described in, for example, R. Bunshah, *Handbook of Deposition Technologies for Films and Coatings, Second Edition*, Noyes Publications, 1994, which is incorporated herein by reference. The preferred easy magnetic axes of the magnetic sublayers can be set during sputter deposition by applying a uniform magnetic field during the deposition process.

Figure 3:
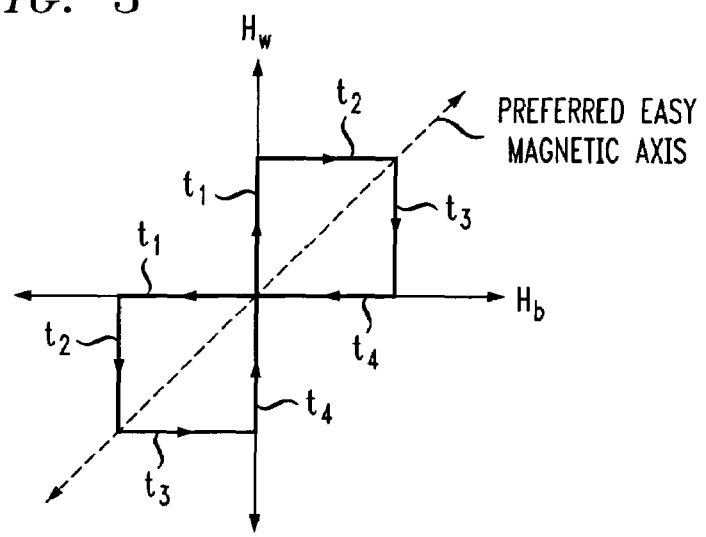
FIG. 3 shows a graph illustrating magnetic field pulse sequences for switching the FIG. 1 embodiment.

A tri-layer structure like the free layer 130 shown in FIGS. 1 and 2 may be switched using toggle-write operations. Such write operations are described in detail in U.S. Pat. No. 6,545,906, which is incorporated herein by reference. Briefly, a toggle-write operation is achieved by using a particular sequence of timed current pulses in the wordline and bitline associated with the particular MTJ. FIG. 3 shows the applied magnetic fields, $H_w$ and $H_b$, resulting from these current pulses for both positive and negative current polarities. At a time $t_0$, no current flows in either the wordline or bitline and the free magnetic moment vectors 133, 137 remain oriented along their preferred easy magnetic axes in a direction 45 degrees from the wordline and bitline. At a time $t_1$, a wordline current is turned on, thereby creating a magnetic field, $H_w$, and the free magnetic moment vectors begin to rotate either clockwise or counterclockwise, depending on the direction of the wordline current, so as to orient themselves in a scissor-like state nominally orthogonal to this applied field direction. Later at a time $t_2$, the bitline current is switched on while the wordline current remains on. The added current in the bitline causes the free magnetic moment vectors to further rotate in the same direction as the rotation induced by the wordline current. At this point in time, the free magnetic moment vectors are nominally orthogonal to the average applied magnetic field direction, $H_w+H_b$, which is 45 degrees with respect to the wordline and bitline.

At a time $t_3$, the wordline current is switched off, so that the free magnetic moment vectors 133, 137 are further rotated only by an applied magnetic field generated by the bitline, $H_b$. At this point, magnetic moment vectors 133, 137 have generally been rotated past their hard axis instability points. Therefore, at time $t_4$, when the bitline current is switched off, the free magnetic moment vectors will tend to align again along their preferred easy magnetic axes. At this point in time, the free magnetic moment vectors have been rotated by 180 degrees and the MTJ has been toggled.

The response of the free magnetic moment vectors 133, 137 to the timed pulse sequences shown in FIG. 3 is made more complicated, however, where there is a mismatch in the magnitude of the free magnetic moment vectors. Such a mismatch will tend to increase the region in magnetic field values over which switching will occur by a direct-write mode. Such a direct-write mode is also described in U.S. Pat. No. 6,545,906. Briefly, where the free magnetic moment vectors are of different magnitudes, or if other asymmetries exist that cause the free magnetic sublayers 132, 136 to act differently under applied fields, an additional energy barrier is created to rotating one of the states. This means that a sequence of applied magnetic fields like that shown in FIG. 3 will describe two regimes. In a first, lower applied field regime, the direct-write mode will be evidenced wherein switching will only occur in one direction. For example, it may only be possible to switch a high resistance state to a low resistance state in this regime. In a higher applied field regime (i.e., higher currents on the wordline and bitline), the additional energy barrier created by the unbalanced free magnetic moment vectors can be overcome, and normal toggle-write operations can occur, as described above.

Figure 4:
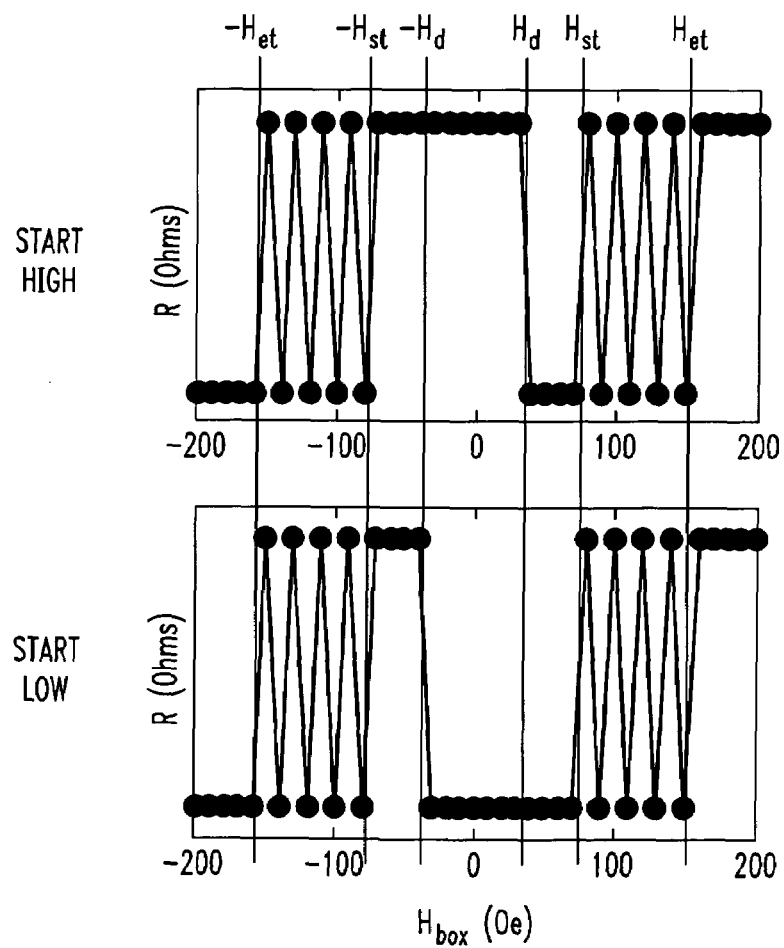
FIG. 4 shows the resistance of an exemplary MTJ in response to the FIG. 3 magnetic field pulse sequences.

FIG. 4 shows switching experiments with an exemplary MTJ comprising a multicomponent free layer. The experiments are started with the exemplary MTJ either in the high resistance state or low resistance state. For illustrative purposes, results are shown for a MTJ with an imbalance in the average magnetic fields acting on the free magnetic sublayers forming the free layer. In these experiments, the wordline and bitline are swept through the box patterns shown in FIG. 3 with progressively larger currents. The x-axis in FIG. 4, labeled $H_{box}$, shows the magnitude of each of the magnetic fields created by the wordline and bitline. It can be seen that the results in FIG. 4 show both the direct-write and toggle-write modes of switching. For example, when starting in the high resistance state, timed pulsing of the currents in the wordline and bitline, as described previously, causes the exemplary MTJ to switch from the high resistance state to the low resistance state when $H_{box}$ reaches a magnitude equal to the direct-write field, $H_d$. Later, as the currents are further increased, the exemplary MTJ starts to switch back and forth between resistance states with each sweep of the currents when $H_{box}$ equals a toggle start field, $H_{st}$. Finally, at even higher currents, toggling is saturated and stops when $H_{box}$ equals a toggle end field, $H_{et}$. Corresponding results are seen when sweeping the currents in the negative direction, and when starting the exemplary MTJ in the low resistance state.

Measurements that determine the ratio of the direct-write region (i.e., $|H_{st}|-|H_d|$) to the toggle start field, $|H_{st}|$, for a given current polarity, therefore, are one means to quantify any asymmetry in the free layer structure or in the average magnetic fields acting on the free magnetic sublayers in a MTJ with a multicomponent free layer. It will be further recognized that the largest toggle-write window (i.e., $|H_{et}|-|H_{st}|$) in such a device is obtained by first balancing the free layer structure so that the moments of the free magnetic sublayers are equal, and then by equalizing the average magnetic fields acting on each of the free magnetic sublayers such that the width of the direct-write region is minimized.

Again referring to FIG. 1, symmetry in the free magnetic moment vectors 133, 137 can be achieved, to some extent, by forming the free magnetic sublayers 132, 136 with the same materials and dimensions, having the free magnetic sublayers have identical anisotropy easy axes, and by reducing Neel coupling between the upper pinned magnetic sublayer 118 and the lower pinned magnetic sublayer. Neel coupling may occur across the barrier layer 120 due to roughness in the interfaces of the barrier layer with the upper pinned magnetic sublayer and lower free magnetic sublayer. Nonetheless, a new source of asymmetry has been discovered that was not previously predicted. Both pinned magnetic sublayers 114, 118 exert magnetic fields that act on each of the free magnetic sublayers. Since the magnitude of magnetic fields characteristically drops off as an inverse square of the distance between objects, the upper pinned magnetic sublayer will tend to exert a greater magnetic field on the lower free magnetic sublayer than will the lower pinned magnetic sublayer. Therefore, if the pinned magnetic sublayers are of the same dimensions, a significant imbalance in the average magnetic fields acting on each of the free magnetic sublayers is created.

Modeling and experimental results also suggest that the magnetic field difference experienced by the free magnetic sublayers 132, 136 becomes progressively worse as the minimum lateral dimensions of the MTJ 100 are reduced. Substantial effects are felt, for example, in circular and elliptical MTJs with minimum lateral dimensions less than about 200 nanometers. The effect of shrinking the device is largely due to the progressively larger dependence of the dipolar field as a function of height above the plane of a pinned magnetic sublayer as the size of the layer is reduced. The average field on each of two free magnetic sublayers arising from two antiparallel pinned magnetic sublayers 114, 118 which are equal in moment is therefore non-zero. Such dipolar fields cause the state wherein the lower free magnetic moment vector 133 is antiparallel to the upper pinned magnetic moment vector 119 to have a lower energy state than that where the two vectors are parallel.

Advantageously, these asymmetries can be reduced by using apparatus and methods within the scope of this invention. In accordance with an aspect of this invention, the thickness of the lower pinned magnetic sublayer 114 in the FIG. 1 embodiment is made thicker than the upper pinned magnetic sublayer 118 in order to substantially equalize the average magnetic fields acting on each of the free magnetic sublayers 132, 136. This thickness difference results in the lower pinned magnetic sublayer having a greater volume, and thereby a greater magnetic moment, than the upper pinned magnetic sublayer. This greater magnetic moment is then utilized to compensate for the larger distance between the lower pinned magnetic sublayer and the free magnetic sublayers, as well as for the lack of significant coupling between the lower pinned magnetic sublayer and the lower free magnetic sublayer.

The favorable effects of such thickness differences have been experimentally verified in addition to being modeled. Experimental tests were performed on MTJs similar in structure to the MTJ 100 in FIG. 1 with diameters of 140 and 125 nanometers. In conformity with the tests described in FIG. 4, the testing consisted of measuring the region of direct writing and the onset of toggling as $H_{box}$ was incrementally increased. Both positive and negative box fields were measured. As predicted, both the width of the direct-write region and the toggle start field decreased as the thickness of the lower pinned magnetic sublayer 114 was initially increased in relation to the upper pinned magnetic sublayer 118. Best performance was observed for these particular MTJs when the lower pinned magnetic sublayer was approximately 20-30 percent thicker than the upper pinned magnetic sublayer. In this case, the width of the direct-write region could be made less than about ten percent of the toggle start field. Such a measurement result suggests that the average magnetic fields acting on each of the free magnetic sublayers are substantially equal to one another.

Figure 5:
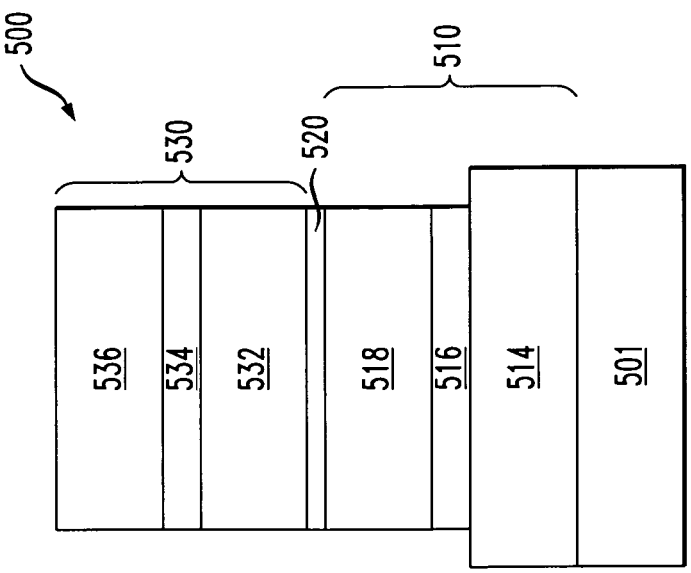
FIG. 5 shows a simplified sectional view of a MTJ in accordance with a second illustrative embodiment of the present invention.

FIG. 5 shows another illustrative embodiment of a MTJ configuration in accordance with aspects of the invention. In FIG. 5, a MTJ 500 comprises an antiferromagnetic layer 501 and a pinned layer 510 comprising a lower pinned magnetic sublayer 514, an antiferromagnetic coupling sublayer 516, and an upper pinned magnetic sublayer 518. Moreover, the MTJ 500 includes a free layer 530 comprising a lower free magnetic sublayer 532, a spacer sublayer 534 which can provide exchange coupling of arbitrary sign and magnitude, and an upper free magnetic sublayer 536. Barrier layer 520 lies in between pinned layer 510 and free layer 530.

The MTJ 500 in FIG. 5 uses width differences between the pinned magnetic sublayers 514, 518 to substantially equalize the average magnetic fields acting on the free magnetic sublayers 532, 536. More specifically, in the illustrative embodiment, the lower pinned magnetic sublayer is wider than the upper pinned magnetic sublayer. Such a configuration can be achieved, to some extent, by tapering the MTJ film stack during patterning by directional (i.e., anisotropic) etching techniques such as reactive ion etching (RIE). However, such RIE techniques may be difficult to control with sufficient precision for forming the sublayers of differing widths. Therefore, the MTJ is preferably created by forming sidewall spacer features on the sidewalls of the MTJ film stack after etching the upper pinned magnetic sublayer but before etching the lower pinned magnetic sublayer. After formation, the sidewall spacer features can act as hard masks during the remainder of the RE process, resulting in a MTJ with pinned magnetic sublayers of differing widths.

The formation of a sidewall spacer feature will be familiar to one skilled in the semiconductor processing art. In summary, a spacer layer is deposited on top of a patterned stack and then anisotropically etched, typically by RIE, to the extent needed to remove the spacer layer from all of the horizontal surfaces of the film stack. When the RIE process is completed, portions of the spacer layer, the sidewall spacer features, remain only on the vertical or near-vertical surfaces. Advantageously, such sidewall spacer formation uses well controlled deposition and RIE steps. The use of sidewall spacer features to create differing widths in the lower and upper pinned magnetic sublayers, therefore, allows greater control than the use of RIE taper angle alone.

With respect to the illustrative embodiment shown in FIGS. 1 and 2, it should be noted that these embodiments had only two pinned magnetic sublayers and two free magnetic sublayers for illustrative purposes and ease of understanding, and that such a configuration should not be interpreted to limit the scope of the invention. For example, more than two free magnetic sublayers may be included in the free layer. Alternatively, more than two pinned magnetic sublayers could be included in the pinned layer. Such a configuration has the advantage of being further capable of being fine tuned to equalize the average magnetic fields acting on the plurality of free magnetic sublayers forming the free layer. One skilled in the art will recognize such variations and improvements from the illustrative embodiments included herein.

Figure 6:
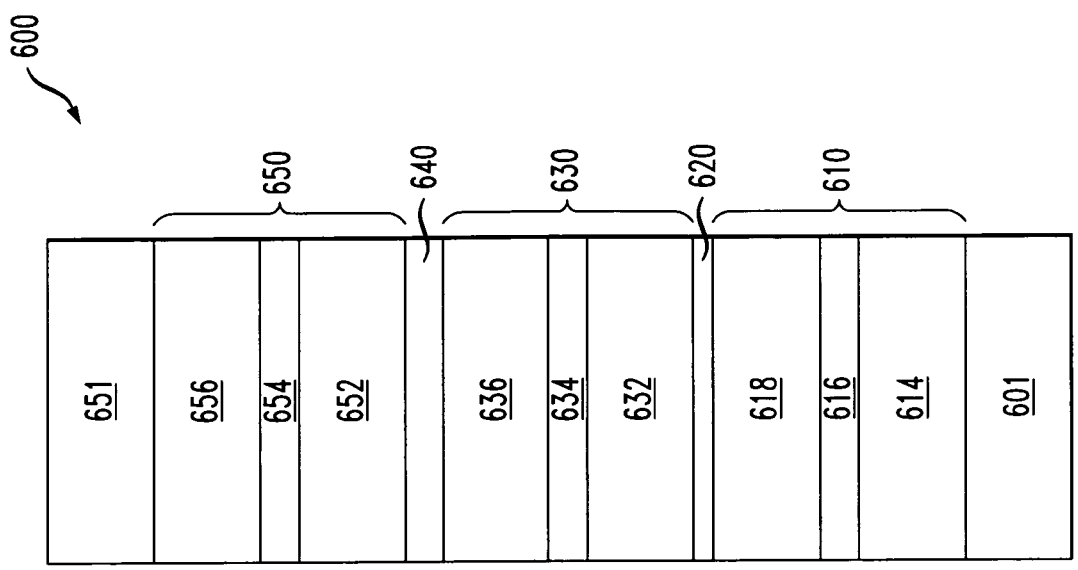
FIG. 6 shows a simplified sectional view of a MTJ in accordance with a third illustrative embodiment of the present invention

Alternatively, in another illustrative embodiment in accordance with this invention, an additional pinned layer is utilized to substantially equalize the average magnetic fields acting on each of the free magnetic sublayers in the MTJ. Such an embodiment is shown in FIG. 6. FIG. 6 shows a MTJ 600 comprising an antiferromagnetic layer 601 and a first pinned layer 610 which, in turn, comprises a lower pinned magnetic sublayer 614, an antiferromagnetic coupling sublayer 616, and an upper pinned magnetic sublayer 618. In addition, MTJ 600 includes a free layer 630 formed above the first pinned layer 610, with a barrier layer 620 between the free layer and first pinned layer. The free layer 630 comprises a lower free magnetic sublayer 632, a spacer sublayer 634 which can provide exchange coupling of arbitrary sign and magnitude, and an upper free magnetic sublayer 636. However, in contrast to the prior embodiments, the MTJ 600 also includes an inverted pinned layer 650 which is formed above the free layer 630. The inverted pinned layer 650 comprises lower and upper pinned magnetic sublayers 652, 656, respectively, separated by an antiferromagnetic coupling sublayer 654. As was the case for other pinned layers, the magnetic moment vectors of the lower and upper pinned magnetic sublayers 652, 656 in the inverted pinned layer 650 are not free to rotate because of the coupling between the inverted pinned layer 650 and an antiferromagnetic layer 651 formed on the inverted pinned layer.

Furthermore, FIG. 6 shows that an additional spacer layer 640 lies between the free layer 630 and the inverted pinned layer 650. This spacer layer should preferably be configured to provide little or no coupling between the free layer and the inverted pinned layer. Candidates for the spacer layer include conductive, non-magnetic materials such as, but not limited to, TaN, Ta and TiN. To maintain geometric symmetry, the spacer layer should be approximately the same thickness as the barrier layer. In addition, the patterning step which is used to define the MTJ 600, such as, for example RIE, should preferably provide a vertical profile throughout the stack to maintain symmetry.

FIG. 6 shows that free magnetic sublayers 632, 636 lie equally in between the four pinned magnetic sublayers 614, 618, 652, 656. One skilled in the art will recognize that this geometric symmetry will act to equalize the average magnetic fields acting on each of these free magnetic sublayers. Advantageously, the sought-after reduction in toggle onset field can thereby be achieved by the addition of the inverted pinned layer 650 to the MTJ 600 in accordance with this invention.

It should be noted that the apparatus and methods described herein may be implemented to form an integrated circuit. In forming integrated circuits, a plurality of identical die is typically fabricated in a repeated pattern on a surface of a semiconductor wafer. Each die includes a device formed in accordance with aspects of the invention described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Moreover, it should also be emphasized that, although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device comprising:
   a free layer, the free layer comprising a plurality of free magnetic sublayers;
   a pinned layer, the pinned layer comprising a plurality of pinned magnetic sublayers, each of the pinned magnetic sublayers exerting a magnetic field on the free magnetic sublayers; and
   a barrier layer formed between the free layer and the pinned layer;
   wherein dimensions of each of the pinned magnetic sublayers are selected to substantially equalize average magnetic fields acting on each of the free magnetic sublayers.

2. The semiconductor device of claim 1, wherein the semiconductor device is a magnetic tunnel junction.

3. The semiconductor device of claim 1, wherein the minimum dimensions of the free layer in a plane substantially parallel to the plane incorporating an interface of the free layer and the barrier layer is less than about 200 nanometers.

4. The semiconductor device of claim 1, wherein the width of a direct-write region of the device is less than about ten percent of a toggle start field of the device.

5. The semiconductor device of claim 1, wherein the free magnetic sublayers have substantially the same dimensions relative to each another.

6. The semiconductor device of claim 1, further comprising a wordline and a bitline corresponding thereto, the wordline and bitline being arranged substantially orthogonal to one another, wherein the free magnetic sublayers each have a preferred easy magnetic axis that is oriented about 45 degrees from the wordline and bitline.

7. The semiconductor device of claim 1, wherein the pinned layer comprises a first pinned magnetic sublayer adjacent to the barrier layer and a second pinned magnetic sublayer separated from the first pinned magnetic sublayer by an antiferromagnetic coupling layer.

8. The semiconductor device of claim 7, wherein magnetic moment vectors of the first and second pinned magnetic sublayers are antiparallel with respect to each other.

9. The semiconductor device of claim 7, wherein the first and second pinned magnetic sublayers have substantially different magnetic moments with respect to each other.

10. The semiconductor device of claim 7, wherein the first and second pinned magnetic sublayers have substantially different dimensions with respect to each other.

11. The semiconductor device of claim 7, wherein the second pinned magnetic sublayer is thicker than the first pinned magnetic sublayer.

12. The semiconductor device of claim 7, wherein the second pinned magnetic sublayer is thicker than the first pinned magnetic sublayer by about 20 to 30 percent.

13. The semiconductor device of claim 7, wherein the second pinned magnetic sublayer is wider than the first pinned magnetic sublayer.

14. The semiconductor device of claim 1, wherein the pinned layer comprises three or more pinned magnetic sublayers.

15. The semiconductor device of claim 1, wherein the semiconductor device further comprises an antiferromagnetic layer in contact with the pinned layer.

16. A semiconductor device comprising:
   a free layer having a first side and a second side opposite the first side, the free layer comprising a plurality of free magnetic sublayers;
   a barrier layer in contact with the first side of the free layer;
   a spacer layer in contact with the second side of the free layer;
   a first pinned layer, the first pinned layer separated from the free layer by the barrier layer and exerting a magnetic field on the free magnetic sublayers; and
   a second pinned layer, the second pinned layer separated from the free layer by the spacer layer and exerting a magnetic field on the free magnetic sublayers;
   wherein at least one of the first and second pinned layers are configured to substantially equalize average magnetic fields acting on each of the free magnetic sublayers.

17. The semiconductor device of claim 16, wherein the spacer layer comprises an electrically conductive material.

18. The semiconductor device of claim 16, wherein the spacer layer has substantially the same thickness as the barrier layer.

19. An integrated circuit comprising at least one semiconductor device, the at least one semiconductor device comprising:
   a free layer, the free layer comprising a plurality of free magnetic sublayers;
   a pinned layer, the pinned layer comprising a plurality of pinned magnetic sublayers, each of the pinned magnetic sublayers exerting a magnetic field on the free magnetic sublayers; and
   a barrier layer formed between the free layer and the pinned layer;

wherein dimensions of each of the pinned magnetic sublayers are selected to substantially equalize average magnetic fields acting on each of the free magnetic sublayers.

20. The integrated circuit of claim 19, wherein the integrated circuit comprises a magnetoresistive random access memory.

21. A method of forming a semiconductor device, the method comprising the steps of:

forming a free layer, the free layer comprising a plurality of free magnetic sublayers;

forming a pinned layer, the pinned layer comprising a plurality of pinned magnetic sublayers, each of the pinned magnetic sublayers exerting a magnetic field on the free magnetic sublayers; and forming a barrier layer in between the free layer and the pinned layer;

wherein the dimensions of each of the pinned magnetic sublayers are selected to substantially equalize average magnetic fields acting on each of the free magnetic sublayers.

* * * * *